(12) United States Patent
Fosnight et al.

(10) Patent No.: US 6,398,032 B2
(45) Date of Patent: *Jun. 4, 2002

(54) SMIF POD INCLUDING INDEPENDENTLY SUPPORTED WAFER CASSETTE

(75) Inventors: William J. Fosnight, Austin, TX (US); Anthony C. Bonora, Menlo Park, CA (US); Raymond S. Martin, San Jose, CA (US); Perry Peterson, Mountain View, CA (US)

(73) Assignee: Asyst Technologies, Inc., Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/073,101

(22) Filed: May 5, 1998

(51) Int. Cl.⁷ ................................................ B65D 85/30
(52) U.S. Cl. ...................................................... 206/711
(58) Field of Search .................... 206/710, 711, 206/712; 414/217, 937, 938, 416, 711

(56) References Cited

U.S. PATENT DOCUMENTS

| | | | |
|---|---|---|---|
| 4,609,103 A | * | 9/1986 | Bimer et al. ............... 206/238 |
| 4,739,882 A | * | 4/1988 | Parikh et al. ............... 206/454 |
| 4,804,086 A | * | 2/1989 | Grohrock ..................... 206/328 |
| 5,482,161 A | * | 1/1996 | Williams et al. ............. 206/711 |
| 5,570,987 A | * | 11/1996 | McKenna ..................... 414/416 |
| 5,711,647 A | * | 1/1998 | Slocum ........................ 414/749 |
| 5,733,024 A | * | 3/1998 | Slocum ..................... 312/223.2 |
| 5,752,796 A | * | 5/1998 | Muka ........................... 414/217 |
| 5,788,082 A | * | 8/1998 | Nyseth ......................... 206/711 |
| H1762 H | * | 12/1998 | Kampf et al. ................ 206/710 |
| 5,915,562 A | * | 6/1999 | Nyseth et al. ............... 206/710 |
| 5,970,621 A | * | 10/1999 | Bazydola et al. .............. 33/613 |
| 6,042,651 A | * | 3/2000 | Roberson et al. ........... 206/711 |

FOREIGN PATENT DOCUMENTS

JP          10-101177       *    4/1998

* cited by examiner

Primary Examiner—Thomas J. Brahan
(74) Attorney, Agent, or Firm—O'Melveny & Myers, LLP

(57) ABSTRACT

A SMIF pod capable of supporting a cassette at points in the pod located directly over or near a kinematic coupling between the pod and a surface on which the pod is supported. Even if the pod shell warps or otherwise deforms, the three points of contact between the pod and the support surface at the kinematic couplings will always remain at a fixed, controllable and repeatable position. The present invention makes use of this fact by supporting the cassette at or near the three kinematic coupling points. Moreover, the support structure is not affixed to the top or sides of the pod shell. Thus, the position of the cassette, and wafers supported therein, will similarly remain at a fixed, controllable and repeatable position, substantially unaffected by any pod shell deformation which may occur.

9 Claims, 5 Drawing Sheets

(Line 2-2)

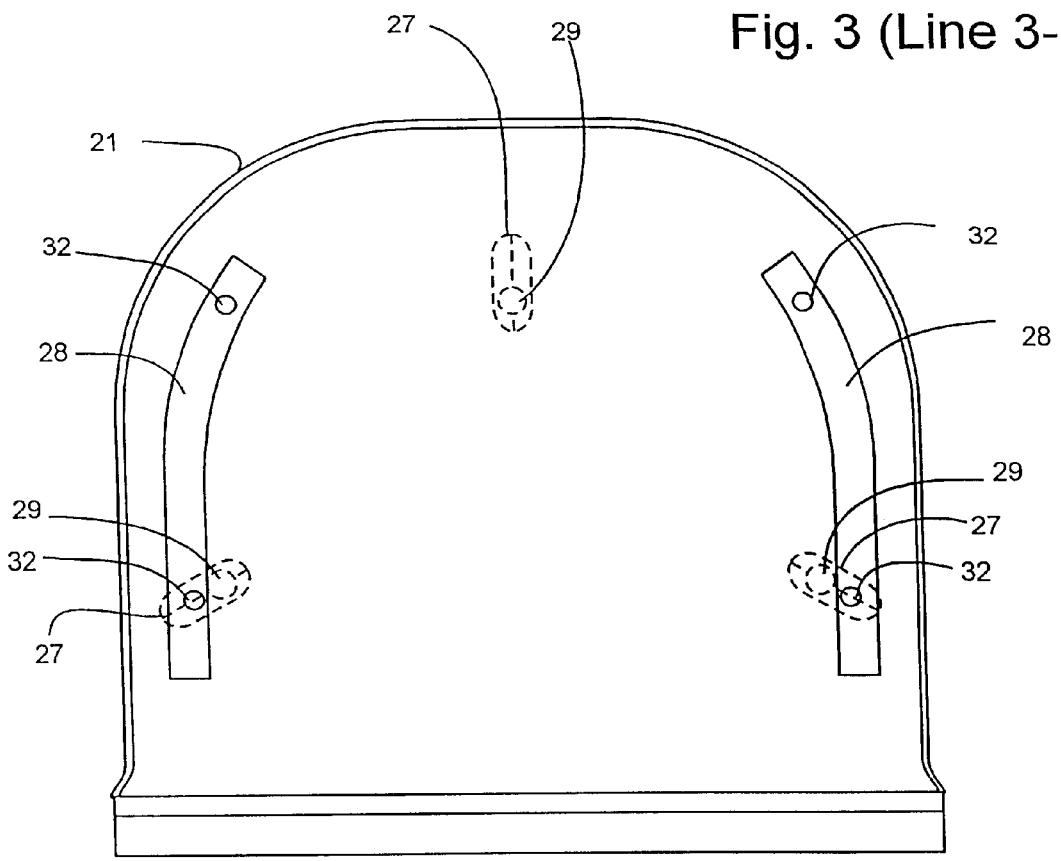
Fig. 3 (Line 3-3)
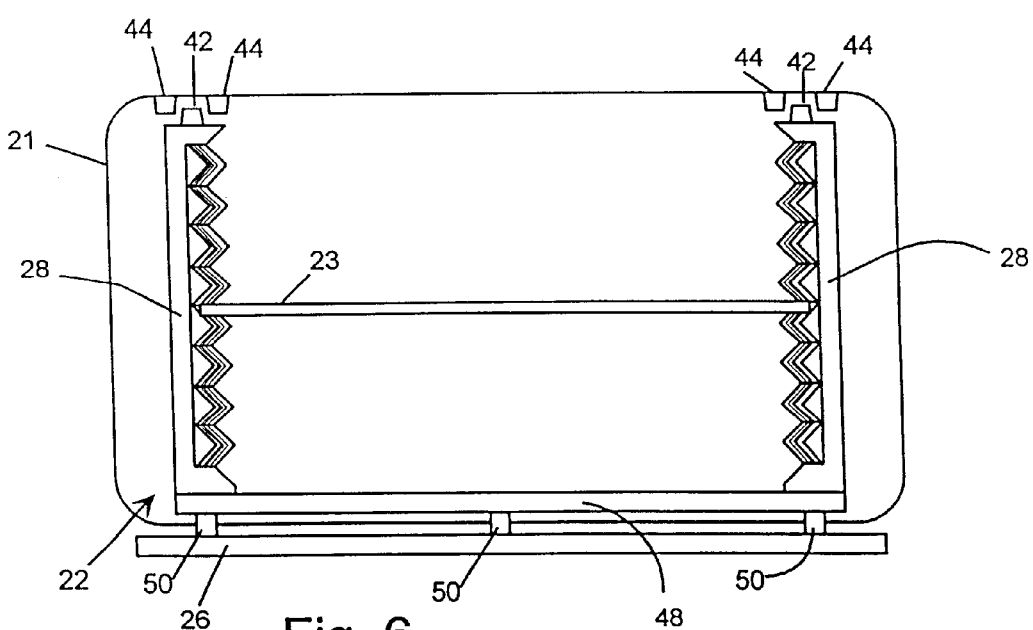
Fig. 6

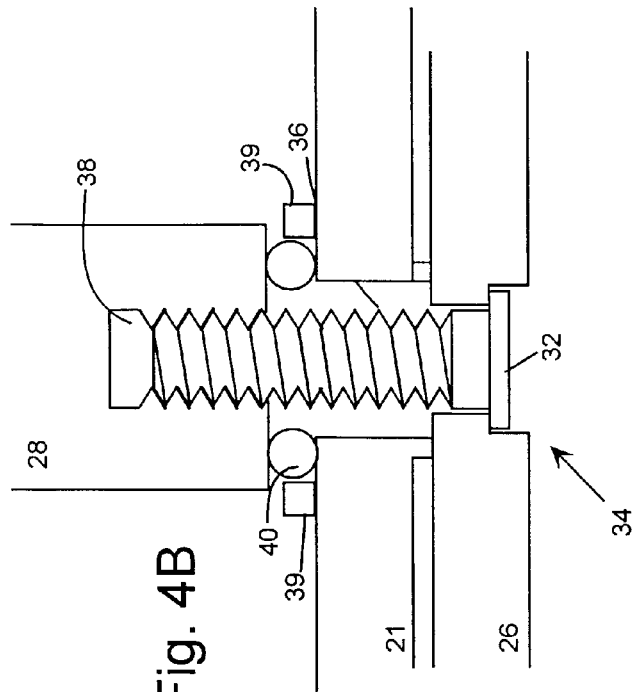
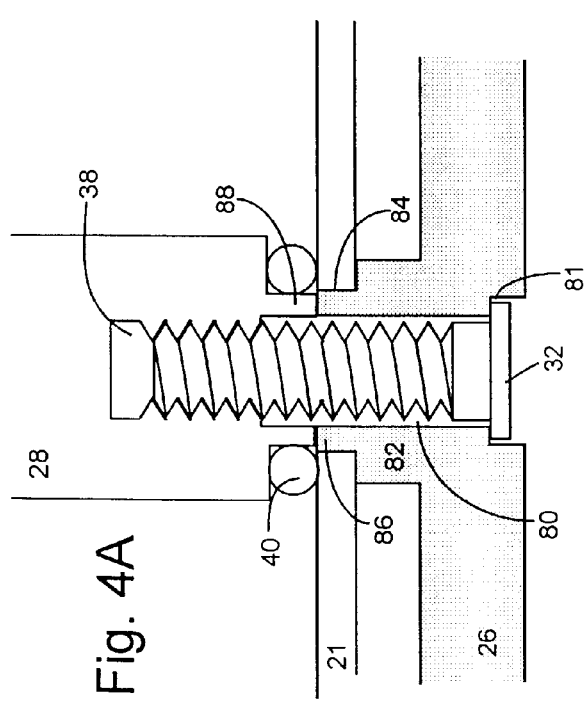
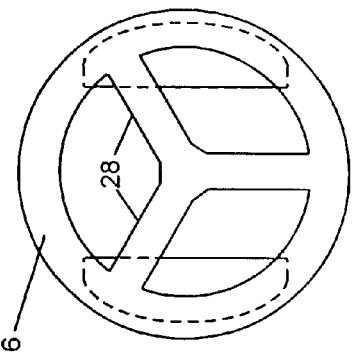
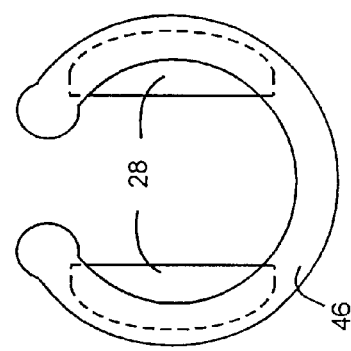
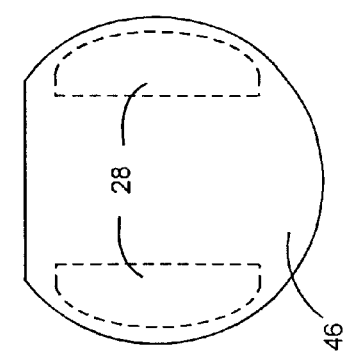

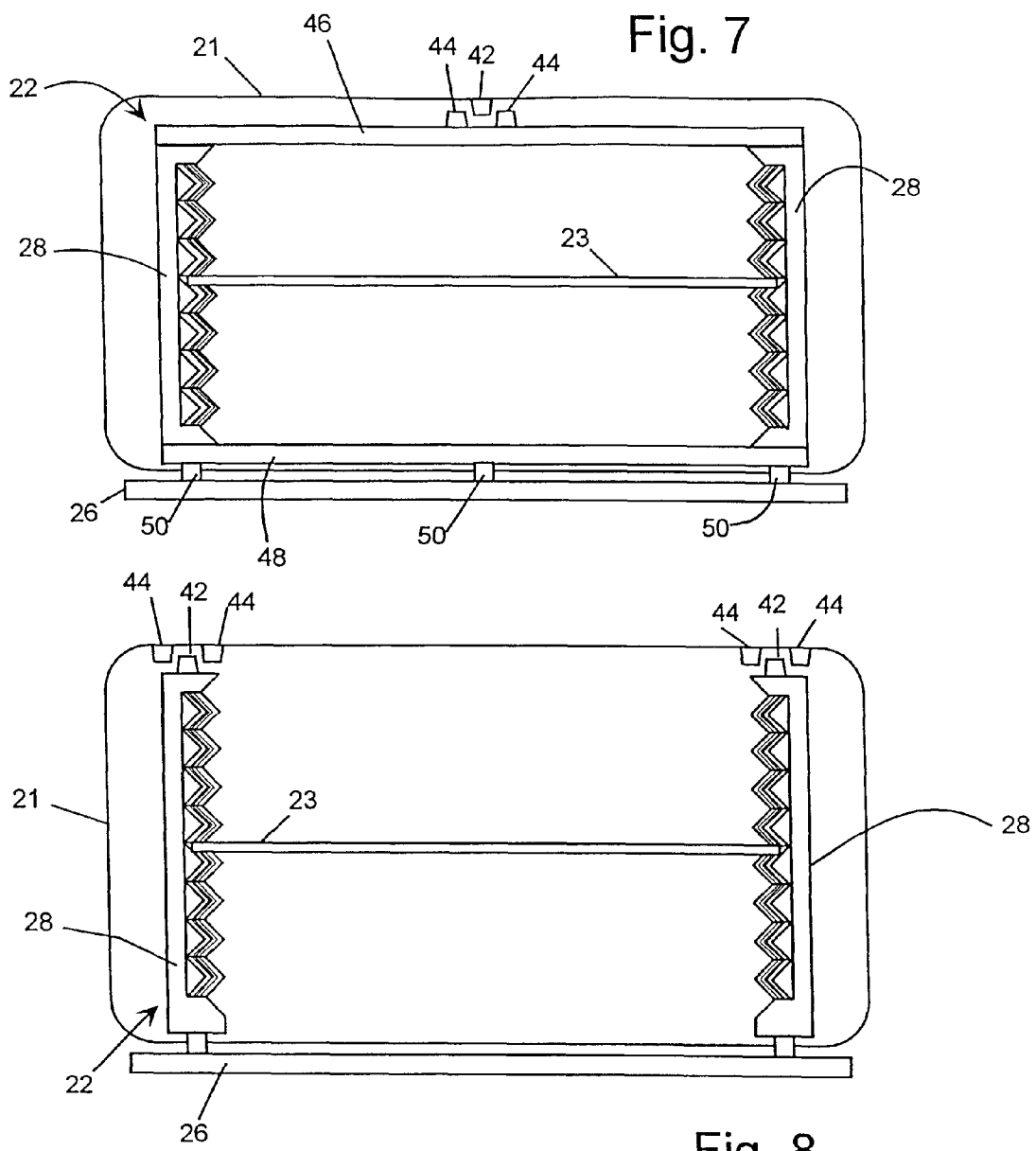
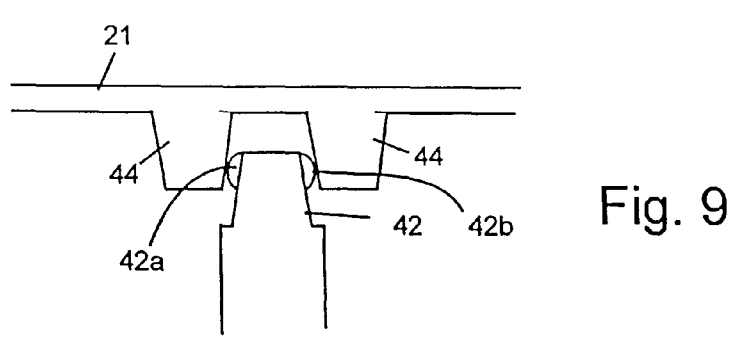

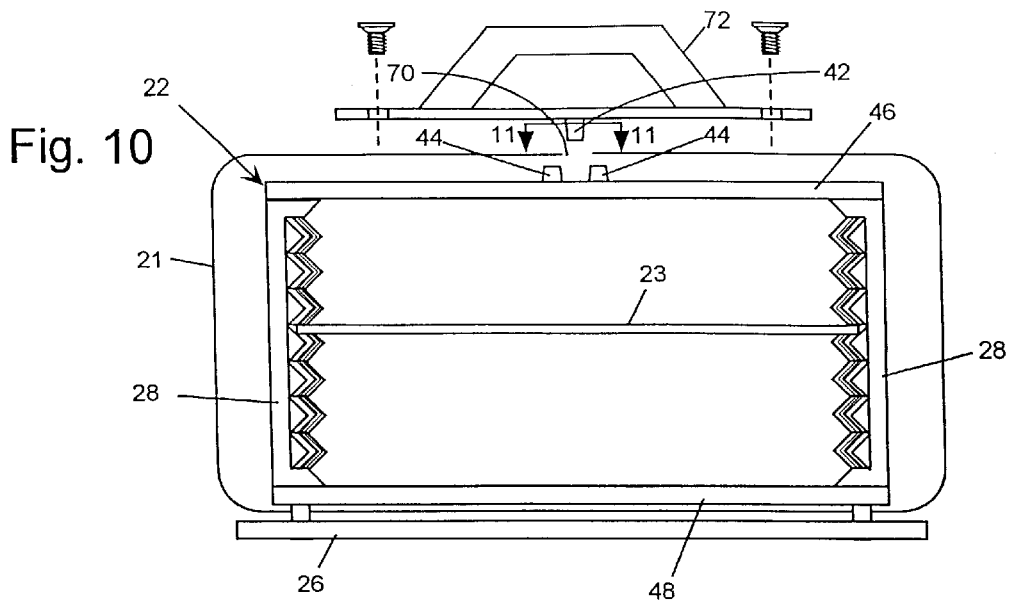
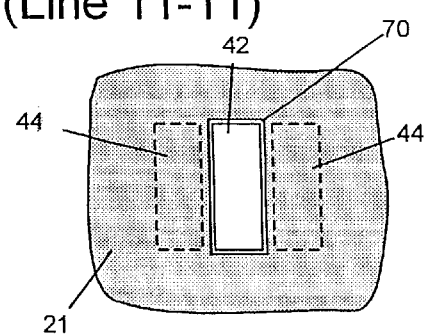
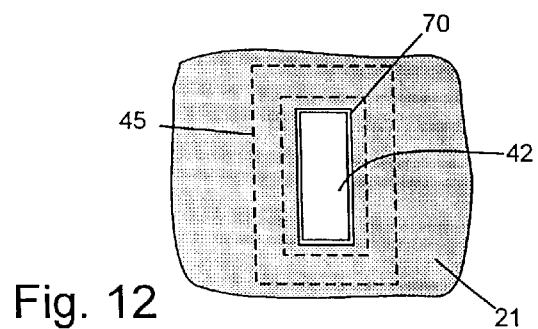
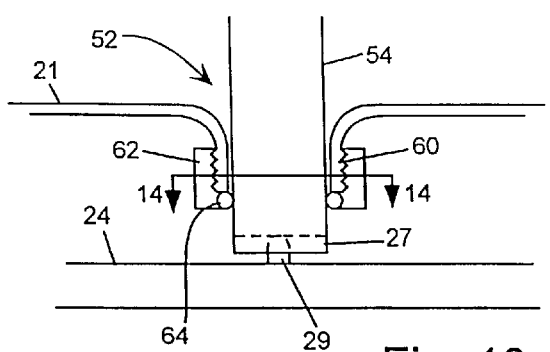
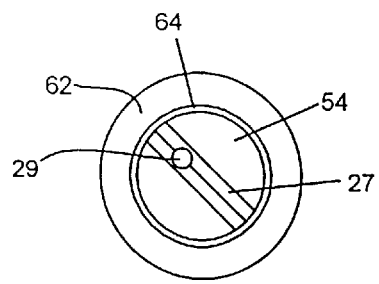

SMIF POD INCLUDING INDEPENDENTLY SUPPORTED WAFER CASSETTE

BACKGROUND OF THE INVENTION

1. Field of the Invention

The present invention relates to SMIF pods, and more particularly to a SMIF pod shell enclosing an independently supported cassette allowing precise, controllable and repeatable positioning of wafers with respect to a surface on which the pod is supported.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Paikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

In practice, a SMIF pod is set down on various support surfaces within a wafer fab, such as for example at a load port to a minienvironment, whereupon interface mechanisms in the load port open the pod door to allow access to the wafers within the pod. Additionally, a pod may be supported at a storage location while awaiting processing at a particular tool. Such storage locations may comprise a local tool buffer in the case of metrology or high throughput tools, or may alternatively comprise a stocker for storing large numbers of pods within a tool bay. A pod may additionally be positioned at a stand-alone purge station.

Whether a tool load port, local tool buffer, stocker or purge station, the support surfaces typically include registration or kinematic pins protruding upward from the support surface. In 300 mm pods, a bottom surface of the pods includes radially extending grooves for receiving kinematic pins. Once the pod is positioned so that the grooves engage their respective kinematic pins, the grooves settle over the pins to establish six points of contact between the pod and support platform (at the grooves and pins) to kinematically couple the pod to the support platform with fixed and repeatable accuracy. Such a kinematic coupling is for example disclosed in U.S. Pat. No. 5,683,118, entitled "Kinematic Coupling Fluid Couplings and Method", to Slocum, which patent is incorporated by reference herein in its entirety. The size and location of the kinematic pins are standardized so that the pods of various suppliers are compatible with each other. The industry standard for the location and dimensions of the kinematic coupling pins are set by Semiconductor Equipment and Materials International ("SEMI").

In general, wafers may be supported within a pod according to one of two configurations. In a first configuration, the wafers may be seated within a removable cassette including a plurality of shelves for supporting the wafers in a planar orientation. The cassette in general includes kinematic pins or grooves on its bottom surface for mating with respective kinematic grooves or pins provided on an upper surface of the bottom of the pod. Thus, in the first configuration, wafers are supported by the wafer cassette, which is in turn supported within the pod, which is in turn supported on a support surface. The second configuration for supporting wafers within a pod is the so-called cassetteless pod. Such pods are used exclusively for front opening applications, and include a plurality of shelves formed on the side walls of the pod itself for supporting the wafers in a planar orientation. An example of such a pod is disclosed in U.S. Pat. No. 5,476,176 to Gregerson entitled, "Reinforced Semiconductor Wafer Holder".

Pods are typically formed of plastics and various polymers such as for example polycarbonate. These materials allow the pods to be efficiently and inexpensively manufactured of a lightweight material which is easily transported, and are typically transparent to allow viewing of the wafers seated therein. While it is conceivable that pods may be manufactured from various metals, metal pods are in general disfavored within wafer fabs owing in part to their weight and potential for ionic contamination.

The desired material characteristics of the wafer cassettes for supporting the wafers are different than those of the pods. It is desirable that the wafer cassettes be more rigid, temperature and wear resistant than the pods, and that the wafer cassettes be static dissipative. For at least these reasons, the pods and wafer cassettes are typically formed of different materials. One preferred material from which the wafer cassettes are formed is polyetheretherkeytone, or "PEEK". Owing in part to its weight, expense and lack of transparency, PEEK is in general not a good material for use in forming a pod.

Once the pods and wafer cassettes are independently formed, the pod shells and wafer supports are generally affixed together in front opening pods to thereby constrain the wafer cassette against movement with respect to the pod shell in all six degrees of movement. That is, the wafer support is prevented from translating along X, Y, and Z cartesian axes, and is prevented from rotating about the X, Y and Z cartesian axes, with respect to the pod shell. The rigidity of the pod shell is relied upon to stabilize and maintain the wafer support in a proper position.

However, conventional pod shells have proven somewhat ineffective in providing a precise, controllable and repeatable positioning of the wafer supports within the pods. One reason is that inherent stresses within the pod shell cause the pod shell to slightly warp or deform over time. Additionally, mechanisms are provided at support surfaces such as for example those at load ports for physically grasping and securing the pod in tight engagement with both the horizontal support surface and the vertical load port. Such grasping and engagement of the pod may further cause deformation of the pod shell. Further still, pods weigh on the order of about twenty pounds. When the pods are lifted from a handle mounted on a top of the pod, as they often are, the pod shells may elongate slightly in the vertical direction, pulling the sides of the pod shell inward. Deformation of the pod shell as a result of any of the above described conditions is communicated directly to the wafer support, which as described above is typically connected to the pod shell in front opening pods.

The deformation or warping of the pod shell can therefore adversely affect the positioning and control of the wafer supports and wafers with respect to each of the X, Y and Z axes, as well as the planarity of the wafers within the wafer support. Conventional process tools use a support surface on which a pod is seated as a reference plane. A wafer access tool for transferring wafers to and from the pod expects the wafers to be at a predetermined height above the reference plane. Any variation in the expected X,Y and/or Z position, or wafer planarity, of the wafers with respect to the support surface may adversely affect wafer access by the wafer access tool, and/or damage the wafers as a result of unexpected contact between the wafers and the wafer access tool or wafer supports.

SUMMARY OF THE INVENTION

It is therefore an advantage of the present invention to provide a system for precise positioning of wafers in a known, controllable and repeatable position with respect to a support surface.

It is a further advantage of the present invention to be able to affix a cassette directly on a support surface such as that at a load port, while simultaneously encasing the wafers within a SMIF pod to isolate the wafers from contaminants and/or particulates.

It is another advantage of the present invention to allow pod-positioning mechanisms at a load port to securely position a pod at a port without jeopardizing a precise, controllable and repeatable positioning of the wafers with respect to the load port.

It is a still further advantage of the present invention to provide a cassette which may be removed from a pod so that the pod and/or cassette may be cleaned, and/or so that cassette may be interchanged within a particular pod.

It is another advantage to provide a system for removing electrostatic charge from the wafers.

It is a further advantage of the present invention to provide a cassette having a modular construction in which the support structure components may be individually removed and replaced by components of the same or different configuration and/or material.

It is a still further advantage of the present invention to allow the pod shell to be formed with thin walls, thereby reducing the weight and manufacturing costs of the pod, while at the same time providing a rigidly controlled positioning of the wafers within the pod shell.

These and other advantages are provided by the present invention which in preferred embodiments relates to a SMIF pod including an independently supported cassette. The pod preferably includes a conveyor plate mounted on its bottom surface, which conveyor plate includes three kinematic grooves for establishing a kinematic coupling on kinematic pins of a support surface on which the pod is seated. The cassette may be provided in a variety of configurations, each of which being capable of supporting a plurality of wafers at a fixed, controllable and repeatable position with respect to a surface on which the pod is supported, substantially regardless of any warping or deformation of the pod shell.

In a preferred embodiment of the invention, the cassette comprises a pair of rigid support columns located at the sides of the pod, and a top plate extending between and connecting the support columns. The support columns preferably include a plurality of shelves, with a shelf from each column together defining a plane in which a single semiconductor wafer may be securely supported. In this embodiment, support columns are preferably attached directly to the conveyor plate, through the pod shell, at or near the kinematic couplings. The top plate further improves the rigidity of the cassette. The top plate may alternatively be omitted, leaving a wafer support structure comprised solely of the pair of support columns rigidly affixed to the conveyor plate.

In further embodiments of the present invention, the cassette may include a bottom plate having legs which connect directly to the conveyor plate through the pod shell. Connected directly to the conveyor plate, the elevation and horizontal planarity of the bottom plate may be precisely, controllably and repeatably maintained. A pair of wafer support columns as described above may be affixed to the bottom plate, and a top plate as described above may further be included.

In embodiments of the present invention not including a bottom plate, a bottom portion of the support columns are fit with threaded bores, preferably two such bores per support column. Screws, located at or near the location of the kinematic couplings, are provided up through the conveyor plate, through a hole in the pod shell, and into the threaded bores in support columns to secure the support columns to the conveyor plate, substantially independent of the pod shell. An O-ring seal may further be provided between the pod and a bottom of the support columns around the threaded bore, so that an air tight seal is provided to prevent particulates and/or contaminants from entering into the pod when the screws are tightened. In a preferred embodiment, each of the wafer support columns, the mounting screws, and the kinematic grooves are electrically static dissipative so that electrostatic charge in the wafers may be drawn away from the wafers through the support columns, mounting screws, kinematic grooves, and finally down through the kinematic pins. In an embodiment of the cassette including a bottom plate, the bottom plate may include a plurality of legs extending down from the bottom plate, which legs are fit with threaded bores for mounting the bottom plate to the conveyor plate via the mounting screws as described above.

In a further embodiment of the present invention, either the support columns or the bottom plate may include legs which extend down through a hole formed in the pod. A bottom surface of each such leg preferably includes a kinematic groove for mating with corresponding pins on a support surface of the pod so that the pins and grooves together form a kinematic coupling directly between the cassette and the support surface. A sleeve having an annular seal, such as for example an O-ring seal, may be affixed to each of the holes in the pod through which a cassette leg extends, so that the sleeves and O-ring together provide a tight seal between the pod and the support structure legs.

This tight seal prevents contaminants and/or particulates from entering into the pod between the pod shell and the support structure legs.

An upper portion of the cassette may include an upwardly extending fin which fits between a pair of fins formed on and extending down from an interior top surface of the pod. The fin arrangement prevents any significant side-to-side movement of the support columns within the pod, as for example upon a shock to the pod. In embodiments of the invention including a top plate, the fin arrangement may be located approximately in the center of the top plate. In embodiments of the invention not including a top plate, the fin arrangement may be provided on one or both of the support columns, preferably at the rear of the support columns.

Even in embodiments of the cassette including the above-described fin arrangement, it is a feature of the various embodiments of the present invention that the cassette is not affixed to the top or sides of the pod shell. Thus, the cassette will support the wafers in a fixed, repeatable and controllable position, which is substantially unaffected by deformation of the pod shell.

BRIEF DESCRIPTION OF THE DRAWINGS

The invention will now be described with reference to the figures in which:

FIG. 3 is a cross-sectional top view through line 3—3 in FIG. 1 further showing the pod door;

FIG. 4A is an enlarged cross-sectional front view of a support column being fastened to the conveyor plate;

FIG. 4B is an enlarged cross-sectional front view of a support column being fastened to the conveyor plate according to an alternative embodiment;

FIGS. 5A–5C are top views of alternative configurations for the cassette top plate;

FIG. 6 is a front view of a pod shell and a wafer cassette according to an alternative embodiment of the present invention;

FIG. 7 is a front view of a pod shell and a wafer cassette according to an alternative embodiment of the present invention;

FIG. 8 is a front view of a pod shell and a wafer support structure comprising a pair of wafer support columns;

FIG. 9 is an enlarged side view of a fin arrangement for limiting side-to-side motion of the wafer cassette with respect to the pod shell;

FIG. 10 is a front view of a pod shell and a wafer cassette further including a handle according to an alternative embodiment of the present invention;

FIG. 11 is a cross-sectional top view through line 11—11 in FIG. 10;

FIG. 12 is a cross-sectional to view showing an alternative fin arrangement to that shown in FIG. 11;

FIG. 13 is an enlarged front view of a leg of a wafer cassette seated through a pod shell and on a kinematic pin on a support surface; and FIG. 14 is a cross-sectional top view through line 14—14 in FIG. 13.

DETAILED DESCRIPTION

The present invention will now be described with reference to FIGS. 1–14, which in general relate to a SMIF pod having an independently supported cassette. It is understood that the SMIF pod according to the present invention may be configured to store wafers of various sizes, including 200 mm and 300 mm wafers, and it is further understood that the SMIF pod according to the present invention may store workpieces other than wafers, such as for example reticules and flat panel displays. Moreover, although the invention is described herein with respect to SMIF systems, it is understood that the present invention may comprise any of several wafer storage and transport containers. The terms "wafer" and "semiconductor wafer" as used herein refer to a wafer substrate as it may exist in any of the various stages of the semiconductor wafer fabrication process. The SMIF pod and cassette described herein comply with and allow compliance with all applicable SEMI standards.

Figure 1:
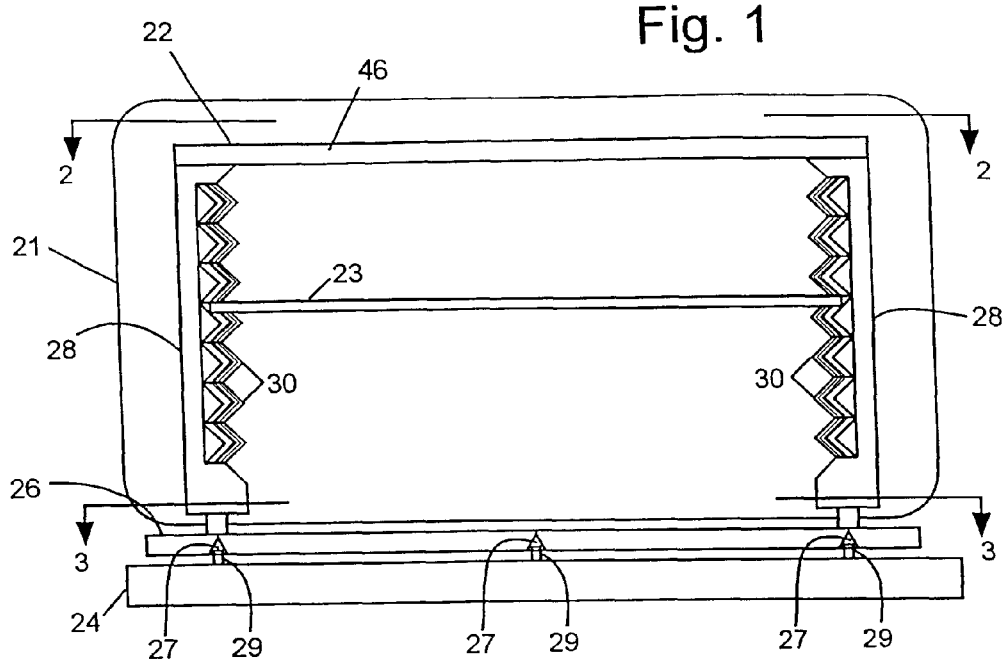
FIG. 1 is a front view of a pod shell and wafer cassette seated on a support surface.
Figure 2:
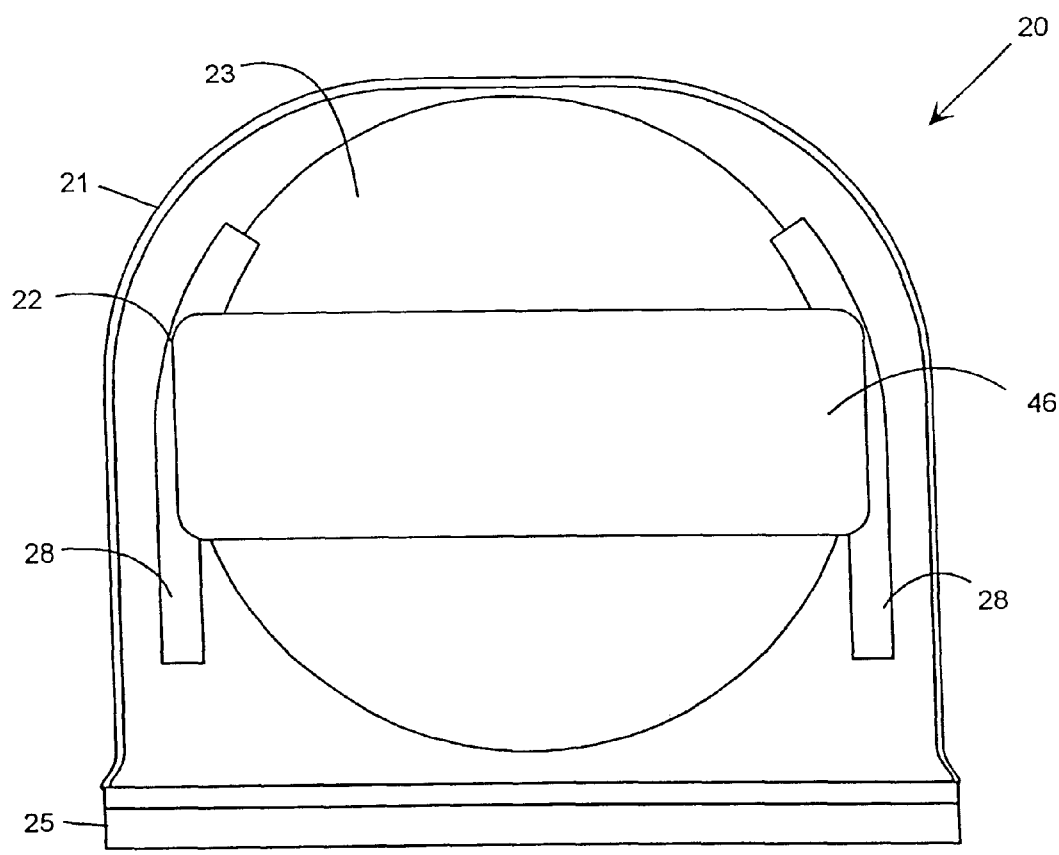
FIG. 2 is a cross-sectional top view through line 2—2 in FIG. 1 further showing the pod door.

Referring now to FIGS. 1 and 2, the present invention in general relates to a SMIF pod 20 capable of housing a cassette 22 at points in the pod located directly over or near the kinematic coupling between the pod 20 and a support surface 24. Even if the pod shell warps or otherwise deforms, the three points of contact between the pod and the support surface at the kinematic couplings will always remain at a fixed, controllable and repeatable position. The present invention makes use of this fact by supporting the cassette at or near the three kinematic coupling points. Moreover, the support structure is not affixed to the top or sides of the pod shell. Thus, the position of the cassette, and wafers supported therein, will similarly remain at a fixed, controllable and repeatable position, substantially unaffected by any pod shell deformation which may occur. In addition to maintenance of a precise positioning of the wafer cassette within the pod shell, where conventional pod shells needed to be thick in order to provide rigidity for supporting the wafer cassette, at least the side and top portions of the pod shell according to the present invention may be made thinner, as the pod shell according to the present invention is not used to maintain positioning of the wafer cassette. Making the pod shell thinner allows a reduction in the overall weight of the pod and a reduction in the material costs in pod fabrication.

As shown in FIGS. 1 and 2, pod 20 is preferably a front opening SMIF pod comprising a pod shell 21 for surrounding one or more wafers 23 and having a front opening through which wafers 23 may be transferred into and out of the pod. The pod 20 further includes a vertically oriented door 25 which may be coupled to the pod shell at the front opening in a known manner to seal the interior of the pod against the surrounding environment. See, for example, U.S. Pat. No. 4,995,430 to Bonora et al. entitled, "Sealable Transportable Container Having Improved Latch Mechanism" for further details relating to the coupling of the pod door to the pod shell. It is understood that the pod 20 need not be a SMIF pod, and may comprise any of various containers for housing different workpieces. Pod 20 may alternatively comprise a bottom opening pod in further embodiments of the invention.

Pod 20 preferably includes a conveyor plate 26 attached to a bottom exterior surface of the pod. Conveyor plate 26 preferably includes three kinematic grooves 27 for seating over three corresponding kinematic pins 29 in a support surface 24 to form a kinematic coupling between the pod and support surface such as described in the Background of the Invention section. The cassette 22 is affixed directly to the conveyor plate 26 through the shell 21 of SMIF pod 20 as explained hereinafter. In a preferred embodiment, SMIF pod 20 and conveyor plate 26 are preferably formed of polycarbonate or various other polymers.

Cassette 22 may be formed of a wide variety of configurations, each of which includes components for supporting one or more wafers 23. A preferred embodiment of cassette 22 is comprised of a pair of wafer support columns 28, and a top plate 46 extending between and connecting the support columns. However, as explained hereinafter, alternative embodiments of the wafer cassette 22 may alternatively or additionally comprise a bottom plate 48 on which the support columns 28 are mounted. Further still, the top and bottom plates may both be omitted, leaving a wafer support structure comprising only the wafer support columns 28 mounted directly to the conveyor plate 26.

The support columns 28 according to a preferred embodiment of the wafer cassette are located at sides of the pod shell 21 adjoining the front opening of the pod. Columns 28 preferably include a plurality of shelves 30, with a shelf from each column together defining a plane in which a single semiconductor wafer may be securely supported. In embodiments of the invention, the shelves of one column may include two raised points and the shelves of the other column may include one raised point (not shown), the three raised points together defining a support plane in which the wafer may rest. It is understood that the raised points on the shelves may be greater than three in number, or may alternatively be omitted entirely, in further embodiments of the invention. The plurality of shelves together support the plurality of wafers in a parallel, spaced and coaxial relation. In one embodiment of the invention, the shelves 30 support the wafers so that each wafer may be separated from the next adjacent wafer by a distance of approximately 10 mm. This distance may vary in alternative embodiments of the invention. The height of wafer support columns 28 as well as the height of pod 20 may vary in alternative embodiments to support varying numbers of wafers.

The wafer support columns 28 are preferably formed from a stable rigid material exhibiting low wear, low particle generation and static dissipation. A preferred material for the columns may be various polymers including carbon fiber-filled polyetheretherkeytone ("PEEK"), or various metals such as for example electroless nickel plated aluminum or quartz. As explained in greater detail below, the columns 28 are preferably static dissipative in a preferred embodiment to dissipate electrostatic charges from the wafers.

Referring now to FIGS. 1, 3 and 4A, the cassette 22 is preferably attached directly to conveyor plate 26 at or near the kinematic couplings, through the pod shell. In a preferred embodiment, the cassette comprising the wafer support columns 28 has four attachment points to the conveyor plate 26, two within each wafer support column 28. One such attachment point of the support columns to the conveyor plate is shown in specific detail in FIG. 4A. As shown therein, a screw 32 is fit through a central opening 80 in the conveyor plate 26 (shown shaded in FIG. 4A for clarity), which central opening 80 is defined by an annular boss 82 formed in and extending upward from the conveyor plate. A bottom portion of the central opening 80 includes a step 81 against which the head of screw 32 may reside. The pod shell 21 includes an opening 84 for receiving an upper portion 86 of the boss 82 therethrough. The bottom of the support columns includes an annular boss 88 which rests against the upper portion 86 of the boss 82. Thus, the support column 28 lies in direct contact with and is directly supported on the conveyor plate 26 in a preferred embodiment. A bottom portion of the support columns include a threaded bore 38 formed therein for receiving screw 32. By rotating screw 32 into the bore 38, the support columns 28 may be fastened to the conveyor plate 26. An O-ring 40 may be provided between the pod shell 21 and a lower surface of the support column, which O-ring is compressed upon rotation of screw 32 within threaded bore 38 to prevent entry of any contaminants and/or particulates into the pod 20. It is understood that the O-ring 40 may be provided below the pod shell 21 in an alternative embodiment of the invention.

An alternative embodiment of the attachment of the support columns 28 to the conveyor plate 26 is shown in FIG. 4B. Reference numerals which are the same in FIGS. 4A and 4B represent identical components. The conveyor plate 26 in the embodiment of FIG. 4B includes a countersunk hole 34. A bottom surface of pod shell 21 similarly includes a hole 36 aligned with the hole 34. A bottom portion of the support columns include a threaded bore 38 formed therein for receiving screw 32. By rotating screw 32 into the bore 38, the support columns 28 may be fastened to the conveyor plate 26. An O-ring 40 may be provided between the pod shell 21 and a lower surface of the support column to prevent entry of any contaminants and/or particulates into the pod 20. Stop blocks 39 may further be provided proximate to the O-ring to limit the degree to which the O-ring may be compressed and to precisely control the height of the support columns 28 over the conveyor plate 26.

Each support column is preferably attached to the conveyor plate at two mounting points with via a screw 32 as shown in FIG. 3. One such attachment point for each support column is located toward the font of the pod, substantially directly over the two front kinematic couplings. As the support columns are located at the sides of the pods, and the rear kinematic coupling is located at a center of the pod, the second mounting point for each wafer support column is aligned with the rear kinematic coupling but is not located directly thereover. The bottom of the pod shell 21 may be made more rigid than the remaining sides of the pod shell, or may include a rib, or area of increased thickness, vertically aligned with the rear kinematic coupling and the two rear mounting points for the support columns 28 to the conveyor plate 26 to increase the rigidity of the pod shell at the rear mounting points of the support columns.

In addition to the support columns, the screws 32 connecting the support columns to the conveyor plates are preferably static dissipative, as are the kinematic grooves 27. Furthermore, the screws 32 nearer the front of the support columns 28 and pod 20 preferably lie within, or in engagement with, the front kinematic grooves on the bottom of conveyor plate 26. Therefore, electrostatic charge from the wafers may be drawn away from the wafers through the kinematic pins via the wafer support columns 28, the screws 32 and the kinematic grooves on the bottom of the conveyor plate 26.

Referring to FIGS. 1 and 2, as previously indicated, a preferred embodiment of the cassette 22 further includes a top plate 46 mounted between and attaching the respective support columns 28 at a top portion of the columns. Top plate 46 may be formed integrally with the support columns 28, or may alternatively be affixed to the support columns via conventional fastening means. The top plate may be formed of various polymers, such as for example PEEK, or various metals, such as for example an aluminum alloy or quartz, and may be of the same or different material as the support columns 28. The top plate 46 shown in FIG. 1 has a substantially rectangular footprint. However, it is understood that top plate 46 may be formed in a wide variety of shapes, including a solid plate with circular and/or straight edges formed to approximately the same size as a wafer as shown in FIG. 5A. It has been observed that the top wafer within a wafer cassette is more susceptible to increased particle deposition velocities due to electrostatic charge variations in the pod shell. Where the top plate 46 is included as a solid plate, the top plate shields the top wafer from these increased particle deposition velocities to thereby reduce particulates and/or contaminants from depositing on the top wafer. Further still, top plate 46 may comprise a solid plate having a central opening, or a plurality of cut out sections as shown in FIGS. 5B and 5C, respectively. Other top plate configurations are contemplated.

The cassette 22 according to the preferred embodiment, comprising the wafer support columns 28 and top plate 46, is not attached to the top or side portions of the pod shell 21. This offers a significant advantage over conventional systems in that deformation and/or warping of the pod shell 21 will have substantially no effect or influence on the cassette 22 and the wafers 23 seated therein. Thus, the wafers may be precisely, repeatably and controllably positioned with respect to the support surface 24 on which the wafers are supported.

In an alternative embodiment of the present invention shown in the front view of FIG. 6, the cassette 22 may be comprised of the support columns 28 mounted on a bottom plate 48, which is in turn affixed to the conveyor plate 26. Bottom plate 48 may include a plurality of legs 50 extending down from a bottom surface of the bottom plate. In a preferred embodiment, the bottom plate may include three legs 50, which are located on the bottom plate at positions substantially corresponding to the positions of the kinematic couplings. It is understood that more than three legs may be provided on the bottom plate 48 in alternative embodiments.

The legs 50 are preferably mounted to conveyor plate 26 through the pod shell 21 via screws 32 and O-rings 40 as described above with respect to FIGS. 4A and 4B, which show the mounting of the support columns 28 to the conveyor plate. As the bottom plate is mounted directly to the conveyor plate at or near the kinematic couplings (FIG. 3), the elevation and horizontal planarity of the top surface of bottom plate 48 may be precisely, controllably and repeatably maintained. With the bottom plate so positioned, it is understood that various configurations of rigid wafer cassettes and support structures may be mounted or supported thereon in accordance with the present invention with the wafers within the cassette or support structure being precisely, controllably and repeatably positioned with respect to the surface 24 on which the pod is supported. While the wafer support columns 28 in this embodiment may be located in the same position relative to the pod as described above, it is understood that the bottom plate itself provides precise, controllable and repeatable positioning of the support structure independent of any pod deformation, and the wafer support columns need not be mounted on the bottom plate over or near the kinematic couplings. As in the above-described embodiment the cassette 22 of FIG. 6 is preferably not affixed to the sides or top of the pod shell 21.

The wafer support columns may be formed integrally with bottom plate 48, or may alternatively be attached to the bottom plate 48 after formation thereof. The bottom plate 48 may be formed of various polymers, such as for example PEEK, or various metals, such as for example an aluminum alloy or quartz, and may be of the same or different material as the support columns 28. Moreover, the bottom plate 48 may be formed to any of the shapes described above with respect to the top plate 46.

In another embodiment of the present invention shown in the front view of FIG. 7, the cassette 22 may comprise a bottom plate 48, wafer support columns 28, and a top plate 46, each of which elements has been described above. Here, the wafer support columns 28 may be affixed to the bottom plate 48, and the top plate 46 may be affixed to a top portion of the columns to form a rigid, four-sided support structure for the wafers. Each of the pair of support columns, top plate and bottom plate may be separately assembled to each other so that the cassette may be formed of different materials. Moreover, if it is desired to alter the cassette, as for example by decreasing or increasing the height of the columns, the cassette may be disassembled, and the new parts inserted. The four sided structure may alternatively be formed integrally in a single fabrication process.

In a still further embodiment of the present invention shown in the front view of FIG. 8, the present invention may comprise a wafer support structure formed solely of a pair of wafer support columns 28 rigidly affixed to the conveyor plate 26 as explained above through the pod shell 21.

The shape of cassette 22 makes the cassette more susceptible to side-to-side movement (when viewed from the front of the pod and cassette) than any other type of movement, as for example upon a shock to the pod. In order to prevent any significant side-to-side movement of the support columns within the pod, top portions of the wafer cassette 22 or support columns by themselves according to further alternative embodiments of the present invention may include a fin 42 positioned between a pair of fins 44 attached to and extending down from a top of the pod shell 21 as shown in the front views of FIGS. 6 and 8. As would be appreciated by those of skill in the art, the positions of the fin 42 and fins 44 may be reversed, so that the fins 44 are affixed to upper portions of the cassette 22, and the fin 42 is affixed to and extends down from the pod shell 21 as shown in FIG. 7. Any of the above described embodiments of the cassette 22 may include the fin arrangement comprising fin 42 and fins 44. The support structure of FIG. 8 may also include the fin arrangement (FIG. 8).

In the event either support column 28 moves left or right (with respect to a view through a front of the pod), fin 42 will engage either of fins 44 to prevent movement of support column 28 beyond that point. In an embodiment including the fin arrangement, the fins 44 preferably prevent the fin 42 from moving a distance of greater than approximately 1 mm, and preferably less than about 0.5 mm from its rest position. It is understood that the spacing between fin 42 and fins 44 may be greater or lesser than that in alternative embodiments of the invention. In an alternative embodiment of the fin arrangement shown in FIG. 9, the fin 42 may include protrusions 42a and 42b to provide a tight fit between the fin 42 and fins 44. The protrusions may alternatively be provided on the fins 44. In this embodiment, the cassette is still free to move in the remaining 5 degrees of movement (i.e., translation in a plane perpendicular to the axis in which the support structure is restrained, and rotation about the three axes), thereby not coupling these modes of pod shell deformation to the cassette.

In embodiments of the invention not including a top plate, such as for example that shown in FIGS. 6 and 8, the fin arrangement is preferably located on the respective support columns 28, near the rear of the columns 28 (with respect to a view of the support columns as shown in FIG. 3). At the rear of the support columns, the fin arrangement is located nearest to the point where the wafers engage the rear of the support columns, which thereby defines the position of the wafers in the X-Y plane. In embodiments of the invention including a top plate, such as for example that shown in FIG. 7, the fin arrangement is preferably located at the center of the top plate.

Further alternative embodiments of the present invention are shown in FIGS. 10 through 12. The pod shell in these embodiment may include an opening 70 in the upper surface of the shell for receiving a handle 72 which may be affixed to the pod shell by conventional means for allowing transport of the pod. The handle may include a fin 42 projecting downward from a bottom surface of the handle and through the hole 70 in the pod shell. This fin may be straddled or engaged by fins 44 on the cassette. An O-ring (not shown) may be provided around the perimeter of the handle or downwardly projecting fin to ensure an air-tight seal between the handle and the pod shell.

As shown in FIG. 11, the fin arrangement of this embodiment may be used to partially restrain movement in one degree of motion. In the alternative embodiment of FIG. 12, the fins 44 may be replaced by a wall 45 formed completely around the fin 42 to prevent side-to-side and backwards and forwards movement of the cassette with respect to the pod, to thus partially restrain movement in two degrees of motion. However, as the fin 42 is located in the center of the pod shell top, any side-to-side or backwards and forwards movement of the pod shell will be minimal. A further feature of the embodiment of FIGS. 10 through 12 is that the above-described fin arrangement may be utilized to dissipate static charge from the wafers, through the cassette and handle in the pod shell.

Up to this point, the cassette 22 has been coupled to the conveyor plate and kinematic couplings thereon as a result of screw 32 fitting through the conveyor plate and pod shell and into a threaded bore in a bottom portion of the cassette. In a still further embodiment of the present invention, the pod shell 21 may include a plurality of holes 52 as shown in FIG. 13 so that a leg 54 mounted on the bottom of the cassette can extend therethrough. In this embodiment, the legs 54 are preferably aligned with the kinematic pins 29 (FIGS. 13 and 14), and include kinematic grooves 27 on their respective bottom surfaces for seating directly on the kinematic pins 29 in the support surface 24. Thus, the cassette 22 in this embodiment is supported directly on the kinematic pins on the support surface to precisely, controllably and repeatably defining a position of the wafers within the support structure 22 with respect to the support surface, substantially independent of the pod position.

In the embodiment shown in FIG. 13, the pod shell 21 is formed with an annular boss 60 having a threaded outer surface for receiving an annular sleeve 62 thereabout. The sleeve may include a sealing ring 64, such as for example an O-ring, which fits snugly around the leg 54 protruding through the hole 52 to thereby prevent particulates and/or contaminants from entering into hole 52 around the leg 54.

The holes 52 through which the legs extend are small in diameter, on the order of approximately 1 inch. This small size substantially prevents any deformation of the pod shell bottom from affecting the position of the legs or cassette. Additionally, the small size of the holes 52 makes it easy to provide an air-tight seal with the O-rings 64.

It is understood that the cassette 22 having a leg 54 according to this embodiment may additionally include any of the above-described cassette components. In particular, the leg 54 may be attached to a bottom surface of a pair of support columns 28 by themselves. Additionally or alternatively, a cassette 22 having legs 54 may include a top plate 46 and/or a bottom plate 48. In a further embodiment of the present invention, it is contemplated that the cassette 22 including legs 54 as described above may be used by itself on a support surface, without a pod 20 thereabout.

In any of the above-described embodiments, it is understood that the cassette 22 may be removed from the pod 20 for cleaning, replacement by a new or different cassette, or for some other purpose. In the embodiments including screws 32 as shown in FIGS. 4A and 4B, the screws may be removed and the cassette thereafter withdrawn from the pod, and in the embodiments including legs 54 as shown in FIG. 13, the sleeve 62 may be removed to allow removal of the cassette. A fixture may be provided for automated removal of the screws and/or the cassette from the pod. Alternatively, this may be accomplished manually.

Although the invention has been described in detail herein, it should be understood that the invention is not limited to the embodiments herein disclosed. Various changes, substitutions and modifications may be made thereto by those skilled in the art without departing from the spirit or scope of the invention as described and defined in the appended claims.

We claim:

1. A system for positioning a workpiece with respect to a support surface having kinematic pins protruding from the support surface, comprising:

a pod, including a pod shell and a support plate, said support plate having kinematic grooves positioned to engage said kinematic pins; and a cassette having a pair of support columns, each support column being concentric with a respective one of said kinematic pins.

2. The system according to claim 1, wherein said cassette further comprises a top plate extending between and connecting said pair of support columns.

3. The system according to claim 2, further comprising a bottom plate, wherein said support columns are seated on said bottom plate.

4. The system according to claim 1, wherein said cassette further has a bottom plate, and said pair of support columns are seated on said bottom plate.

5. The system according to claim 1, said cassette further including a first fin extending from a surface of said cassette, and said pod shell including a second fin extending from a surface of said pod shell, wherein said first fin is capable of engaging said second fin to limit movement of said cassette with respect to said pod shell.

6. A system for positioning a semiconductor wafer within a container, comprising:

a pod including a pod shell and a pod door, said pod shell having a top surface, a bottom surface, sides between said top surface and bottom surface, and at least one fin extending from said pod shell; and a cassette capable of supporting the semiconductor wafer, said cassette is affixed only with said pod door, and further having at least one fin extending from said cassette so that the movement of said fin extending from said cassette is restrained by said fin extending from said pod shell to limit movement of said cassette with respect to said pod shell.

7. A system as recited in claim 6, wherein said wafer cassette comprises a pair of support columns for supporting said wafer, and a top plate extending between and connecting said pair of support columns.

8. A system according to claim 7, further comprising a bottom plate, wherein said support columns are seated on said bottom plate.

9. A system according to claim 6, wherein said wafer cassette comprises a bottom plate, and a pair of wafer support columns seated on said bottom plate.

* * * * *